US008903681B2

(12) United States Patent
Adest et al.

(10) Patent No.: US 8,903,681 B2
(45) Date of Patent: Dec. 2, 2014

(54) MONITORING OF DISTRIBUTED POWER HARVESTING SYSTEMS USING DC POWER SOURCES

(71) Applicant: Solaredge Technologies Ltd., Hod Hasharon (IL)

(72) Inventors: Meir Adest, Raanana (IL); Lior Handelsman, Givataim (IL); Yoav Galin, Raanana (IL); Amir Fishelov, Tel Aviv (IL); Guy Sella, Bitan Aharon (IL)

(73) Assignee: Solaredge Technologies Ltd., Hod Hasharon (IL)

( * ) Notice: Subject to any disclaimer, the term of this patent is extended or adjusted under 35 U.S.C. 154(b) by 0 days.

(21) Appl. No.: 13/901,890

(22) Filed: May 24, 2013

(65) Prior Publication Data

US 2013/0332093 A1 Dec. 12, 2013

Related U.S. Application Data

(63) Continuation of application No. 11/951,419, filed on Dec. 6, 2007, now Pat. No. 8,473,250.

(60) Provisional application No. 60/916,815, filed on May 9, 2007, provisional application No. 60/908,095, filed (Continued)

(51) Int. Cl.
*G06F 15/00* (2006.01)
*G01D 4/00* (2006.01)
*H02J 3/38* (2006.01)

(52) U.S. Cl.
CPC .............. *G01D 4/004* (2013.01); *Y02B 70/343* (2013.01); *H02J 3/383* (2013.01); *Y04S 20/322*

(Continued)

(58) Field of Classification Search
None
See application file for complete search history.

(56) References Cited

U.S. PATENT DOCUMENTS

| 4,161,771 A | 7/1979 | Bates |
| 4,549,254 A | 10/1985 | Kissel |

(Continued)

FOREIGN PATENT DOCUMENTS

| CN | 101136129 A | 3/2008 |
| CN | 101488271 A | 7/2009 |
| CN | 101523230 A | 9/2009 |

OTHER PUBLICATIONS

Extended European Search Report—EP14151651.8—Mailing date: Feb. 25, 2014.

(Continued)

*Primary Examiner* — Jonathan C Teixeira Moffat
*Assistant Examiner* — Hien Vo
(74) *Attorney, Agent, or Firm* — Banner & Witcoff, Ltd.

(57) ABSTRACT

A monitoring system and method for monitoring performance of individual powers sources in a distributed power source system. A monitoring module is coupled to each of the power sources, or to each string of serially connected power sources, to monitor and collect data regarding current, voltage, temperature and other environmental factors at the power source. The collected data is transmitted over a power line to a central analysis station for analysis. Data collected from each source indicates malfunction or degradation at the source. Comparison of data collected from adjacent sources filters for environmental factors impacting neighboring sources such as cloudy days for a solar panel. Comparison of data collected from the same source at different times indicates soiling or degradation of the source with time or periodic events such as a moving shade from an adjacent building.

20 Claims, 9 Drawing Sheets

Related U.S. Application Data on Mar. 26, 2007, provisional application No. 60/868,962, filed on Dec. 7, 2006, provisional application No. 60/868,851, filed on Dec. 6, 2006, provisional application No. 60/868,893, filed on Dec. 6, 2006.

(52) U.S. Cl.
CPC ....... (2013.01); *Y02B 90/245* (2013.01); *Y02B 70/346* (2013.01); *Y02B 90/242* (2013.01); *Y04S 20/525* (2013.01); *Y02E 10/563* (2013.01); *Y04S 20/34* (2013.01); *Y04S 20/40* (2013.01); *Y02B 70/3208* (2013.01); *Y02B 90/248* (2013.01); *Y04S 20/52* (2013.01)
USPC ................. 702/182; 702/60; 702/61; 307/77; 307/82

(56) References Cited

U.S. PATENT DOCUMENTS

| | | | |
|---|---|---|---|
| 4,639,844 | A | 1/1987 | Gallios et al. |
| 4,685,040 | A | 8/1987 | Steigerwald et al. |
| 4,686,617 | A | 8/1987 | Colton |
| 4,864,213 | A | 9/1989 | Kido |
| 5,289,361 | A | 2/1994 | Vinciarelli |
| 5,917,722 | A | 6/1999 | Singh |
| 6,441,597 | B1 | 8/2002 | Lethellier |
| 6,545,211 | B1* | 4/2003 | Mimura ..................... 136/244 |
| 6,633,824 | B2* | 10/2003 | Dollar, II ..................... 702/58 |
| 6,693,781 | B1 | 2/2004 | Kroker |
| 7,495,419 | B1 | 2/2009 | Ju |
| 8,570,017 | B2 | 10/2013 | Perichon et al. |
| 2003/0058662 | A1 | 3/2003 | Baudelot et al. |
| 2005/0105224 | A1* | 5/2005 | Nishi ............................. 361/18 |
| 2005/0162018 | A1* | 7/2005 | Realmuto et al. ............... 307/44 |
| 2006/0176716 | A1 | 8/2006 | Balakrishnan et al. |
| 2007/0030068 | A1 | 2/2007 | Motonobu et al. |
| 2009/0217965 | A1 | 9/2009 | Dougal et al. |
| 2011/0056533 | A1 | 3/2011 | Kuan |

OTHER PUBLICATIONS

Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003, pp. 650-656, XP031895550, ISBN: 978-4-88552-196-6.

Yuqing Tang: "High Power Inverter EMI characterization and Improvement Using Auxiliary Resonant Snubber Inverter", Dec. 17, 1998, XP055055241, Blacksburg, Virginia Retrieved from the Internet: URL:http:jjscholar.lib.vt.edu/theses/available/etd-012299-165108/unrestricted/THESIS.PDF, [retrieved on Mar. 5, 2013].

Yoshida M et al: "Actual efficiency and electromagnetic noises evaluations of a single inductor resonant AC link snubber-assisted three-phase soft-switching inverter", INTELEC 2003. 25th. International Telecommunications Energy Conference. Yokohama, Japan, Oct. 19-23, 2003; Tokyo, IEICE, JP, Oct. 23, 2003, pp. 721-726, XP031895560, ISBN: 978-4-88552-196-6.

Third party observation—EP07874025.5—Mailing date: Aug. 6, 2011.

Extended European Search Report—EP 13152967.9—Mailing date: Aug. 28, 2014.

\* cited by examiner

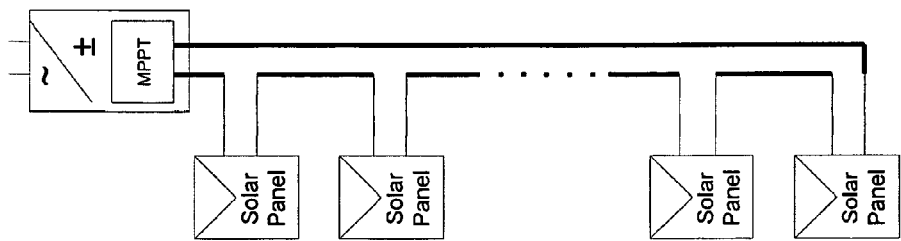
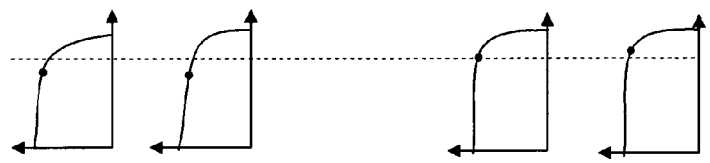
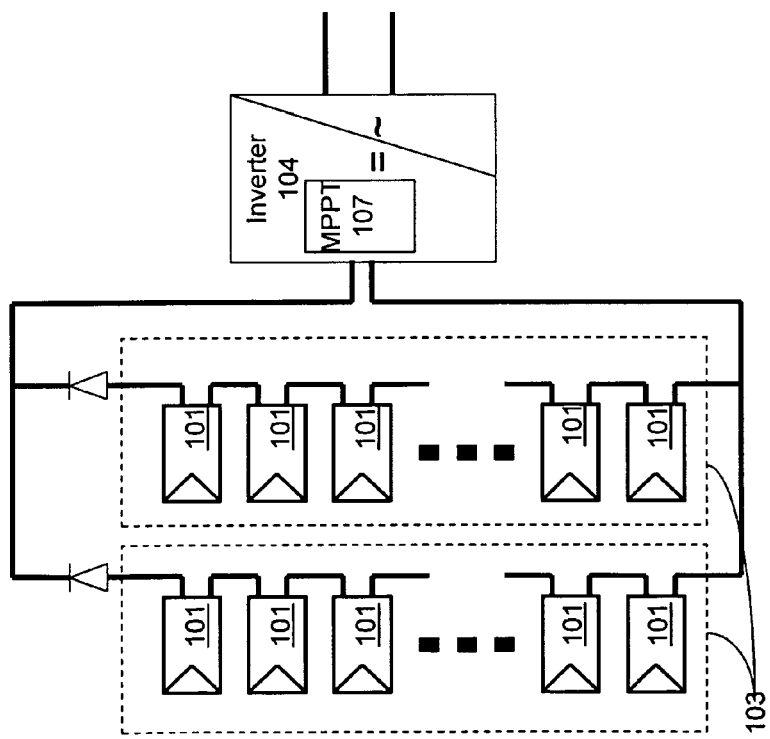

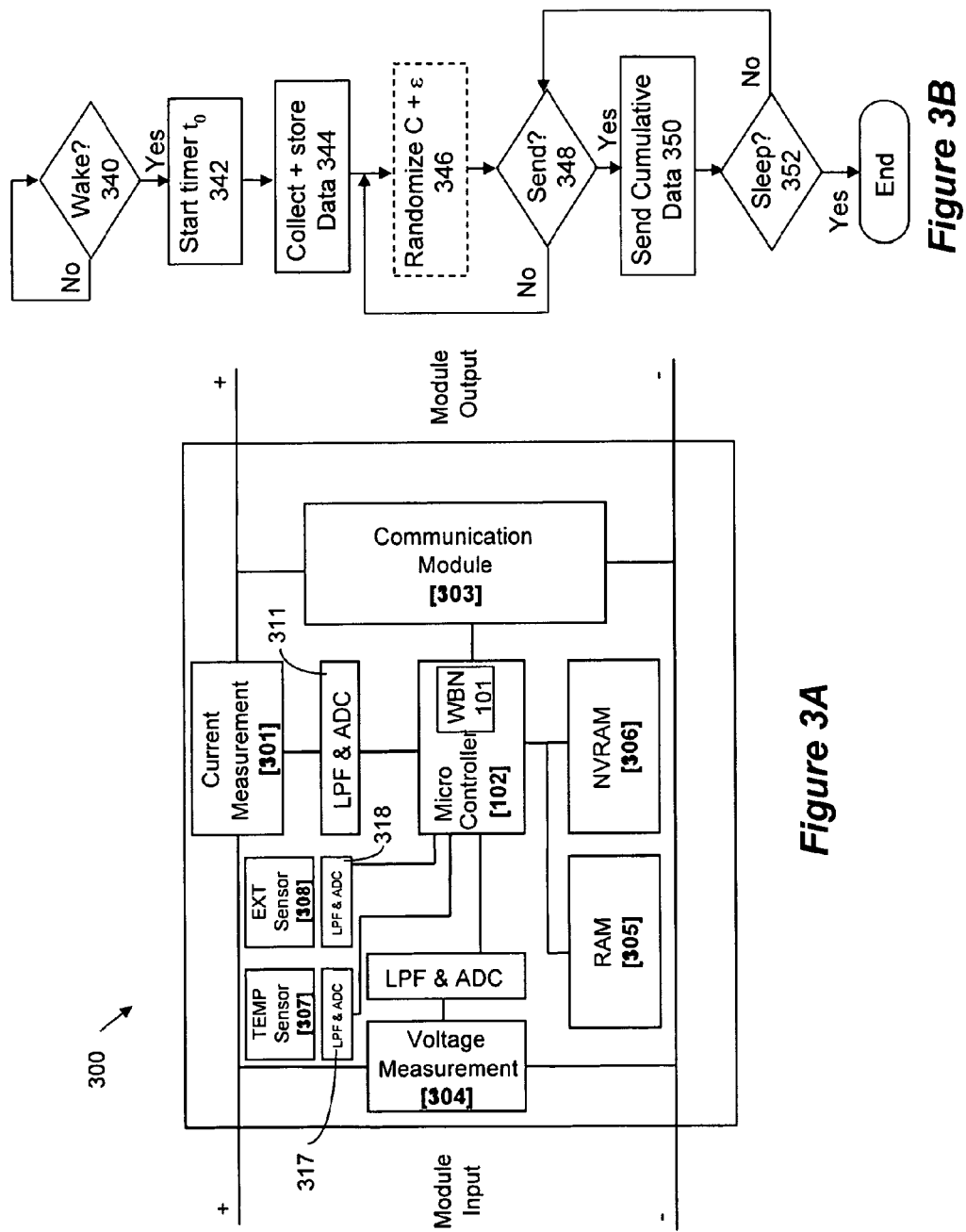

MONITORING OF DISTRIBUTED POWER HARVESTING SYSTEMS USING DC POWER SOURCES

CROSS-REFERENCE TO RELATED APPLICATIONS

This application is a continuation of U.S. patent application Ser. No. 11/951,419 filed Dec. 6, 2007, titled "Monitoring of Distributed Power Harvesting Systems Using DC Power Sources", which claims priority to U.S. Provisional patent application Ser. No. 60/868,851, filed Dec. 6, 2006, and titled "Distributed Solar Array Monitoring, Management and Maintenance," Ser. No. 60/868,893, filed Dec. 6, 2006, and titled "Distributed Power Harvesting System for Distributed Power Sources," 60/868,962, filed Dec. 7, 2006, and titled "System, Method and Apparatus for Chemically Independent Battery," Ser. No. 60/908,095, filed Mar. 26, 2007, and titled "System and Method for Power Harvesting from Distributed Power Sources," and Ser. No. 60/916,815, filed May 9, 2007, and titled "Harvesting Power From Direct Current Power Sources." The entire contents of the above-identified applications are incorporated herein by reference. Further, this application is related to ordinary U.S. patent application Ser. No. 11/950,224, filed Dec. 4, 2007, titled "Current Bypass for Distributed Power Harvesting Systems Using DC Power Sources," patent application Ser. No. 11/950,271, filed Dec. 4, 2007, titled "Distributed Power Harvesting Systems Using DC Power Sources," patent application Ser. No. 11/950,307, filed Dec. 4, 2007 titled "A Method for Distributed Power Harvesting Using DC Power Sources," "Removable Component Cartridge for Increasing Reliability in Power Harvesting Systems," and "Battery Power Delivery Module," that are filed in at the U.S. Patent and Trademark Office on Dec. 6, 2007 and incorporates the entire content of these applications by this reference.

BACKGROUND

1. Field of the Invention

The field of the invention generally relates to management of distributed DC power sources and, more particularly, to monitoring of distributed DC power sources, such as solar cell array, fuel cells, batteries, and similar applications.

2. Related Arts

The recent increased interest in renewable energy has led to increased research in systems for distributed generation of energy, such as photovoltaic cells (PV), fuel cells, batteries (e.g., for hybrid cars), etc. Various topologies have been proposed for connecting these power sources to the load, taking into consideration various parameters, such as voltage/current requirements, operating conditions, reliability, safety, costs, etc. For example, most of these sources provide low voltage output (normally lower than 3V), so that many of them need to be connected serially to achieve the required operating voltage. Conversely, a serial connection may fail to provide the required current, so that several strings of serial connections may need to be connected in parallel to provide the required current.

It is also known that power generation from each of these sources depends on manufacturing, operating, and environmental conditions. For example, various inconsistencies in manufacturing may cause two identical sources to provide different output characteristics. Similarly, two identical sources may react differently to operating and/or environmental conditions, such as load, temperature, etc. In practical installations, different source may also experience different environmental conditions, e.g., in solar power installations some panels may be exposed to full sun, while others be shaded, thereby delivering different power output. While these problems and the solutions provided by the subject invention are applicable to any distributed power system, the following discussion turns to solar energy so as to provide better understanding by way of a concrete example.

A conventional installation of solar power system 10 is illustrated in FIG. 1. Since the voltage provided by each individual solar panel 101 is low, several panels are connected in series to form a string of panels 103. For a large installation, when higher current is required, several strings 103 may be connected in parallel to form the overall system 10. The solar panels are mounted outdoors, and their leads are connected to a maximum power point tracking (MPPT) module 107 and then to an inverter box 104. The MPPT 107 is typically implemented as part of the inverter 104.

The harvested power from the DC sources is delivered to the inverter 104, which converts the fluctuating direct-current (DC) into alternating-current (AC) having a desired voltage and frequency, which, for residential application, is usually 110V or 220V at 60 Hz or 220V at 50 Hz. The AC current from the inverter 104 may then be used for operating electric appliances or fed to the power grid. Alternatively, if the installation is not tied to the grid, the power extracted from the inverter may be directed to a conversion and charge/discharge circuit to store the excess power created as charge in batteries. In case of a battery-tied application, the inversion stage might be skipped altogether, and the DC output of the MPPT stage 107 may be fed into the charge/discharge circuit.

FIG. 2 illustrates one serial string of DC sources, e.g., solar panels 201a-201d, connected to MPPT circuit 207 and inverter 204. The current versus voltage (IV) characteristics are plotted (210a-210d) to the left of each DC source 201. For each DC source 201, the current decreases as the output voltage increases. At some voltage value the current goes to zero, and in some applications may assume a negative value, meaning that the source becomes a sink. Bypass diodes are used to prevent the source from becoming a sink. The power output of each source 201, which is equal to the product of current and voltage (P=I*V), varies depending on the voltage drawn from the source. At a certain current and voltage, the power reaches its maximum. It is desirable to operate a power generating cell at this maximum power point. The purpose of the MPPT is to find this point and operate the system at this point so as to draw the maximum power from the sources.

Various environmental and operational conditions impact the power output of DC power sources. For example, the solar energy incident on various panels, ambient temperature and other factors impact the power extracted from each panel. Depending on the number and type of panels used, the extracted power may vary widely in the voltage and current. Changes in temperature, solar irradiance and shading, either from near objects such as trees or far objects such as clouds, can cause power losses. Owners and even professional installers find it difficult to verify the correct operation of the system. With time, many more factors, such as aging, dust and dirt collection and module degradation affect the performance of the solar array.

Data collected at the inverter 104 is not sufficient to provide proper monitoring of the operation of the system. Moreover, when the system experiences power loss, it is desirable to ascertain whether it is due to environmental conditions or from malfunctions and/or poor maintenance of the components of the solar array. Furthermore, it is desirable to easily locate the particular solar panel that may be responsible for the power loss. However, to collect information from each panel requires some means of communication to a central data gathering system. The data gathering system needs to be able to control data transmission, avoid transmission collisions, and ascertain each sender of data. Such a requirement can be most easily accomplished using a duplex transmission method. However, a duplex transmission method requires additional transmission lines and complicates the system. On the other hand, one-way transmission is prone to collisions and makes it difficult to compare data transmitted from the various sources.

Consequently, conventional methods in the field of solar array monitoring focus mainly on the collection of the output parameters from the overall solar array. Due to the wide variability of power output of such systems, and the wide range of environmental conditions that affect the power output, the output parameters from the overall system are not sufficient to verify whether the solar array is operating at peak power production. Local disturbances, such as faulty installation, improper maintenance, reliability issues and obstructions might cause locals power losses which are difficult to detect from overall monitoring parameters.

For further discussion of the above issues relating to distributed power sources and solar panels, the reader is highly encouraged to review the following literature, which may or may not be prior art.

Cascade DC-DC Converter Connection of Photovoltaic Modules, G. R. Walker and P. C. Sernia, *Power Electronics Specialists Conference,* 2002. (*PESC*02), Vol. 1 IEEE, Cairns, Australia, pp. 24-29.

Topology for Decentralized Solar Energy Inverters with a Low Voltage AC-Bus, Bjorn Lindgren.

Integrated Photovoltaic Maximum Power Point Tracking Converter, Johan H. R. Enslin et al., IEEE Transactions on Industrial Electronics, Vol. 44, No. 6, December 1997.

A New Distributed Converter Interface for PV Panels, R. Alonso et al., 20$^{th}$ European Photovoltaic Solar Energy Conference, 6-10 Jun. 2005, Barcelona, Spain.

Intelligent PV Module for Grid-Connected PV Systems, Eduardo Roman, et al., IEEE Transactions on Industrial Electronics, Vol. 53, No. 4, August 2006. Also in Spanish patent application ES2249147.

A Modular Fuel Cell, Modular DC-DC Converter Concept for High Performance and Enhanced Reliability, L. Palma and P. Enjeti, Power Electronics Specialists Conference, 2007, PESC 2007, IEEE Volume, Issue, 17-21 Jun. 2007 Page(s):2633-2638. Digital Object Identifier 10.1109/PESC.2007.4342432.

Experimental Results of Intelligent PV Module for Grid-Connected PV Systems, R. Alonso et al., Twentyfirst European Photovoltaic Solar Energy Conference, Proceedings of the International Conference held in Dresden, Germany, 4-8 Sep. 2006.

Cascaded DC-DC Converter Connection of Photovoltaic Modules, G. R. Walker and P. C. Sernia, IEEE Transactions on Power Electronics, Vol. 19, No. 4, July 2004.

Cost Effectiveness of Shadow Tolerant Photovoltaic Systems, Quaschning, V.; Piske, R.; Hanitsch, R., Euronsun 96, Freiburg, Sep. 16-19, 1996.

Evaluation Test results of a New Distributed MPPT Converter, R. Orduz and M. A. Egido, 22nd European Photovoltaic Solar Energy Conference, 3-7 Sep. 2007, Milan, Italy.

Energy Integrated Management System for PV Applications, S. Uriarte et al., 20th European Photovoltaic Solar Energy Conference, 6-10 Jun. 2005, Barcelona, Spain.

U.S. Published Application 2006/0185727

SUMMARY

The following summary of the invention is provided in order to provide a basic understanding of some aspects and features of the invention. This summary is not an extensive overview of the invention, and as such it is not intended to particularly identify key or critical elements of the invention, or to delineate the scope of the invention. Its sole purpose is to present some concepts of the invention in a simplified form as a prelude to the more detailed description that is presented below.

According to aspects of the invention, there is provided a monitoring system employing one-way transmission. Collisions are avoided or minimized by a novel transmission timing scheme. The novel transmission method also voids the necessity to synchronize the transmission of data. According to aspects of the invention, each transmission carries a unique ID of the data source. The data is collected and stored at a central analysis system, and various analysis is performed on the data to ascertain the operation parameters of each transmission source and of the entire system. According to further aspects of the invention, a mechanism for sending an interrupt message is provided. When a fault is detected in any of the power sources, an interrupt message may be sent that overrides all other messages, so that the fault may be detected immediately. According to aspects of the invention, all data transmission is done using power line communication (PLC). Alternatively, other modes of transmission may be used, such as wireless or dedicated transmission lines, such as Ethernet, RS232, RE485, etc.

According to aspects of the invention, a monitoring system for distributed DC power installation is provided, comprising: a plurality of power sources; a plurality of monitoring modules, each monitoring module associated with one of the power sources and collecting performance data of the associated power source; a plurality of transmitters, each transmitter associated with one of the monitoring modules and transmitting the performance data; a plurality of controllers, each associated with one of the transmitters and controlling transmission events according to elapsed time from timer initialization. Each of the power sources may be connected to a power line and wherein each transmitter transmits the performance data over the power line. Each of the monitoring modules comprises: a current measurement module for collecting the current data; and a voltage measurement module for collecting the voltage data. Each of the monitoring modules may further comprise a temperature sensor module for sensing the temperature data at the power source. Each of the monitoring modules may further comprise an arc detection module for detecting arcing at the power source. Each of the monitoring modules may further comprise a timer, and wherein each controller initializes the timer whenever the associated power source starts to generate power. Each of the monitoring modules may further comprise a randomizer for varying time increments for controlling transmission events. The monitoring system may further comprise a memory storing the performance data accumulated since timer initialization. The monitoring system may further comprise: a central analysis station; and, a communication translator for receiving the performance data from the monitoring modules and transmitting the performance data to the central analysis station. The central analysis station may analyze fault detection. The central analysis station may compare measured power to expected power determined based on external data. Each of the power sources may comprise a solar panel. Each of the power sources may comprise a string of serially connected solar panels. Each of the monitoring modules may comprise a current measurement module for collecting current data. The monitoring system may further comprise: a connection box for parallel coupling all of the string of serially connected solar panels; and, a voltage measuring module measuring the voltage of the parallel coupling. The monitoring system may further comprise: a connection box for parallel coupling all of the string of serially connected solar panels; and, total current measuring module measuring the total current of the parallel coupling. The monitoring system may detect current leakage by comparing output of the total current measuring module to the sum of current measuring modules of each of the monitoring modules.

According to aspects of the invention, a method for monitoring distributed power harvesting systems including DC power sources is provided, the method comprising: individually monitoring power generation at each of the DC power sources and, when power generation passes a threshold at one of the DC power sources, performing the steps: initializing a timer for the power source; collecting performance data for the power source; monitoring passage of time period of the timer and, when the time period reached a setup time, transmitting the collected performance data to a central analysis station. Collecting performance data may further comprise storing the performance data in memory, and wherein transmitting the collected performance data comprises transmitting the collected performance data accumulated since initialization of the timer. Collecting performance data may comprise measuring at least one of output voltage and output current. The method may further comprise comparing performance data for at least one of the DC power sources to performance data from the same DC power source at a different time. The method may further comprise comparing performance data for at least one of the DC power sources to performance data from adjacent ones of the DC power sources. The method may further comprise comparing performance data for at least one of the DC power sources to expected performance data based on external parameters. Monitoring passage of time period may further comprise introducing randomness to the setup time. The method may further comprise serially connecting a plurality of solar panels to form each of the DC power sources. Transmitting the collected performance data may comprise sending the collected performance data over a power line.

According to aspects of the invention, a distributed DC power harvesting system is provided, comprising: a plurality of solar panels serially connected to form a string of panels coupled to a power line; at least one monitoring module connected to the string of panels and gathering performance data from at least one solar panel, the monitoring module comprising: a transmitter for transmitting the performance data over the power line; a controller for controlling transmission events of the transmitter according to elapsed time from timer initialization; and, a receiving station coupled to the power line and receiving the performance data from the transmitter. The receiving station may further comprise at least one of a voltage and current sensor. The receiving station may further comprise a transmitter for relaying at least the performance data received from the power line. The transmitter may comprise a wireless transmitter. The monitoring module may comprise and least one of: a current measurement module for collecting current data from at least one solar panel; and a voltage measurement module for collecting voltage data from at least one solar panel. The monitoring module may further comprise a temperature sensor. The monitoring module may further comprise a timer, and wherein the controller initializes the timer whenever an associated panel starts to generate power. The monitoring module may further comprise a randomizer for varying time increments for controlling transmission events. The system may further comprise a memory storing the performance data accumulated since timer initialization. The system may further comprise: one or more additional string of panels; a connection box for parallel coupling of the string of panels and the one or more additional string of panels; and, a voltage measuring module measuring the voltage of the parallel coupling.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates a conventional solar power system.

FIG. 2 illustrates one serial string of DC sources and current versus voltage characteristic curve for the solar panels.

FIG. 3A illustrates a monitoring module according to aspects of the invention.

FIG. 3B is a flow chart illustrating a method for transmission of data according to various aspects.

DETAILED DESCRIPTION

Figure 4:
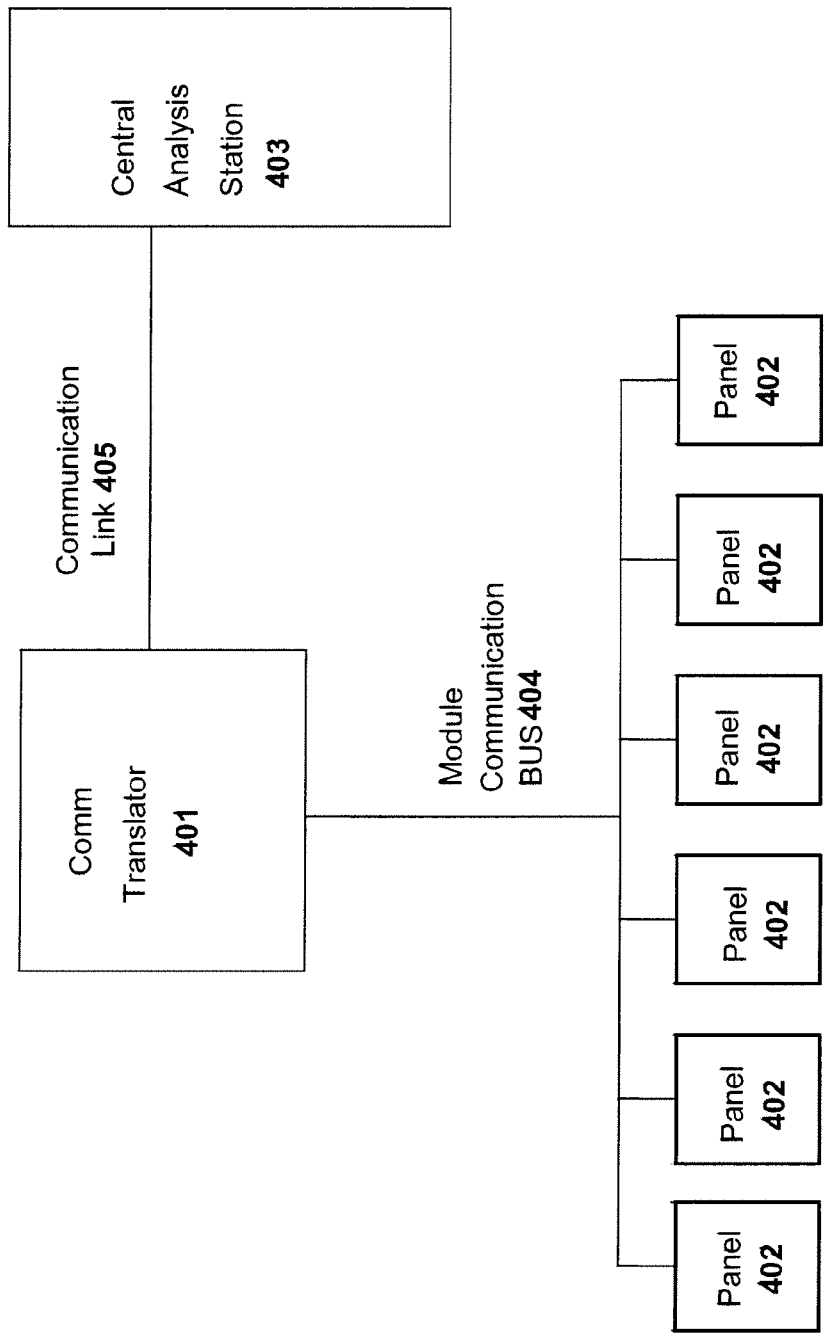
FIG. 4 shows a communication and analysis system, according to aspects of the invention, being associated with the monitoring module of FIG. 3A.

Aspects of the present invention provide a monitoring system for solar panel system. The monitoring system includes modules that may be attached to each solar panel of the solar system. The monitoring module will monitor several parameters including, etc., panel voltage, panel current, panel temperature, lighting conditions, spatial orientation (e.g., tilt), and other parameters. The information from each monitoring module may be transmitted to a central management unit together with a unique module ID. The transmission may be done over the powerlines, in wireless form, or with dedicated wiring—such as Ethernet, RS-232, RS-485 or other. In one aspect of the invention, transmission is done as power line communication in a one-way implementation. Collisions are avoided or minimized by using a unique transmission timing mechanism.

The central management unit may analyze the data from all solar panels. The monitoring system can be implemented at the string level, at the panel level or even at the cell level. The principle applicable at the panel level monitoring may be applied for string level and cell level. Moreover, the innovative monitoring system may be used in small installation, such as residential solar panel installations, and large installations, such as large solar panel field power plants.

Analysis of the data may enable detection and pinpointing of most of the common failures associated with solar array power loss. Further, smart analysis of current and historical data can also be used to suggest corrective measures such as cleaning or replacing a specific portion of the solar array. The system can also detect normal power losses caused by environmental conditions and prevent costly and difficult solar array testing. Additionally, analysis of the data can lead to suggestion for environmental corrective actions. For example, it may suggest changing the tilt or location of specific panels, or removing of obstacles that block the sun under certain conditions not realized at the time of installation.

FIG. 3A shows a monitoring module according to aspects of the invention. The exemplary monitoring module 300, according to aspect of the invention, is used to collect and transmit date from each solar panel, such as the solar panel 101 of FIG. 1. Data from all monitoring modules is transmitted via a communication system to a central analysis station, which analyzes the data and displays the status of the solar array.

The monitoring module 300 includes several sub-modules. The sub-modules within the monitoring module 300 include a current measurement module 301, a microcontroller 302, a communication module 303, a voltage measurement module 304, a random access memory (RAM) module, a non-volatile RAM or NVRAM module 306, a temperature sensor 307 and one or more external sensor interfaces 308.

The microcontroller module 302 is coupled to the other modules and controls the other modules. In one exemplary aspect shown in FIG. 3A, the current measurement module 301 is located in series with the input and output ports to the monitoring module 300. The location of the current measurement module 301 may vary depending on the type of current measurement device used in the module. In the exemplary aspect shown, the voltage measurement module 304 is located in parallel across the input port to the monitoring module 300. Voltage measurement devices are usually placed in parallel with the component whose voltage is being measured. In the exemplary aspect shown, the communication module 303 is shown as located in parallel with the output ports of the monitoring module 300. There is no requirement for a particular location for this module and the location shown is arbitrary. The sensor modules while coupled to the microcontroller module 302, are not shown as coupled to the input or output ports of the monitoring module 300. These sensor modules, however, may derive power from the panel connected to the monitoring module 300 and, therefore, may be located along a circuit path from the input to the output ports of the monitoring module 300. A power unit may be used to feed monitoring module 300. The power may be derived from one of many power sources, such as batteries or feed-in from another location. In one embodiment the monitoring module 300 may be fed from power harvested from the solar panel being monitored.

In various aspects of the invention, inclusion of some of the modules, such as the temperature sensor 307, is optional.

The monitoring module 300 can be implemented using discrete components or may be integrated to obtain an application specific integrated circuit (ASIC).

The measurement modules 301, 304 and the sensor modules 307, 308 may have filter circuits and analog to digital conversion circuits associated with them. FIG. 3A shows low-pass filter and analog to digital conversion circuits 311, 314, 317, 318 each associated with a corresponding measurement and sensor module.

Current and voltage measurement modules 301, 304 are used to collect current and voltage data. The collected data is transferred to the microcontroller module 302. The microcontroller module 302 may be a digital state machine. The microcontroller stores the collected information in its local RAM 305. Pre-defined data, stored in the NVRAM module 306, may be used to control the activity of the microcontroller 302.

The data collected by the current and voltage measurement modules 301, 304 and transferred to the microcontroller 302 may be subsequently transmitted to a central analysis station described below with respect to FIG. 4. The communication module 303 is used to transmit the data from the microcontroller 302 or from storage in RAM 305 to outside of the monitoring module 300.

The current measurement module 301 may be implemented by various techniques used to measure current. In one aspect of the invention, the current measurement module 301 is implemented using a very low value resistor. The voltage across the resistor will be proportional to the current flowing through the resistor. In another aspect of the invention, the current measurement module 301 is implemented using current probes which use the Hall Effect to measure the current through a conductor without the need to add a series resistor. After translating the current to voltage, the data passes through a low pass filter and is digitized. The low-pass filter and the analog to digital converter associated with the current measurement module 301 are shown as module 311 in FIG. 3A. As with the voltage measurement module, care must be taken to choose the correct resolution and sample rate for the analog to digital converter. If the current sensing technique does not require a series connection, then the monitoring module 300 may be connected to the panel in parallel. For a parallel connection, there is no need to disconnect the panel during the connection.

In one aspect of the invention, the voltage measurement module 304 uses simple parallel voltage measurement techniques in order to measure the voltage output of the solar panel. The analog voltage is passed through a low pass filter in order to minimize aliasing. The data is then digitized using an analog to digital converter. The low-pass filter and the analog to digital converter associated with the voltage measurement module 304 are shown as module 314 in FIG. 3A. The analog to digital converter 314 has sufficient resolution to correctly evaluate the voltage from the solar panel. The low-pass filter makes it possible for low sample rates to be sufficient for evaluating the state of the panel.

The optional temperature measurement module 307 enables the system to use temperature data in the analysis process. The temperature may be indicative of several types of failures and problems. Furthermore, the panel temperature is a factor in the power output from the panel and in the overall power production.

The one or more external sensor interfaces 308 enable connecting various external sensors to the monitoring module 300. These sensors are optional and may be used where they enable enhanced analysis of the state of the solar array. Examples of external sensors that may be used at the external sensor interfaces 308, include ambient temperature sensor, solar irradiance sensors, spatial orientation such as tilt sensor, sensors from neighboring panels and the like. When a type of sensor is regularly used, then it may be integrated into the monitoring module 300 instead of being an external component.

The microcontroller module 302 manages the monitoring process. The tasks performed by the microcontroller module 302 includes gathering information from the current and voltage measurement modules 301, 304, storing the information in local memory 305, 306 and transmitting the stored information to outside of the monitoring module 300. The microcontroller module 302 uses the information stored in memory in order to control its operation. This operating information may be stored in the non-volatile memory of the NVRAM module 306, to preserve the information even when power-loss occurs. Information in the NVRAM module 306 may include information about the microcontroller module 302 such as the serial number, the type of communication bus used, the status update rate and the ID of the central analysis station to which the data is transmitted. This information may be added to the parameters collected by the measurement modules 301, 304 before transmission out of the monitoring module 300.

Figure 5:
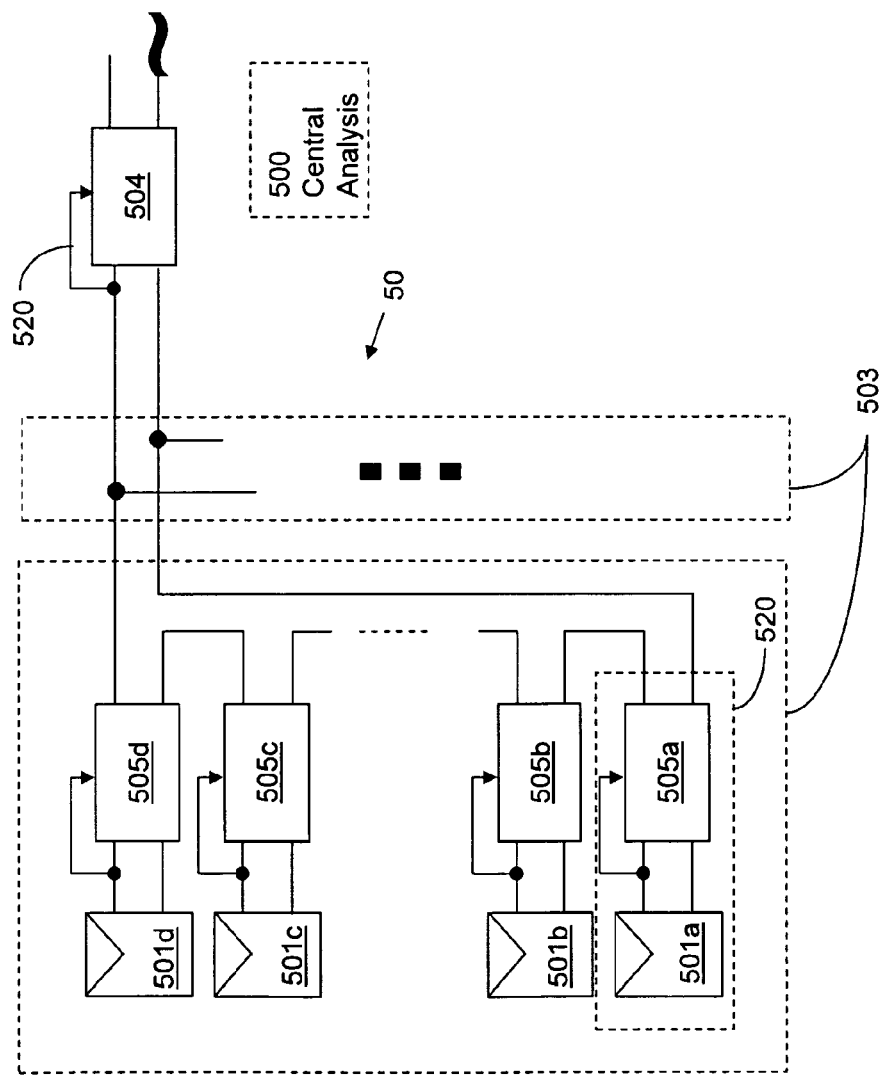
FIG. 5 shows a distributed power harvesting system, including a monitoring module, according to aspects of the invention.

The installation process of the monitoring module 300 includes connecting each of the monitoring modules 300 to a panel such as the solar panel 101 of FIG. 1 or the solar panel 505 of FIG. 5. The measurement features of the monitoring module 300 may be used to ensure that the panel and the monitoring module are properly connected and to record the serial number of the monitoring module 300 or the microcontroller within the monitoring module. The measurement features 301, 304, or other sensors, such as GPS, tilt etc., may also be used to determined physical location of the connection and the array connection topology. These parameters may be used by an analysis software at the central analysis station 403 to detect problems in the solar panels and the array.

The monitoring module 300 may be installed during the installation of the solar array or retrofitted to an existing installation. In both cases the monitoring module may be connected to the panel junction connection box or to the cables between the panels. The monitoring module may be provided with the connectors and cabling needed to enable easy installation and connection to the panels and cables.

The monitoring module 300 shown in FIG. 3A collects current, voltage and some other optional types of data from each of the panels in a distributed DC power harvesting system. Data from each panel is subsequently transmitted for analysis. The communication module 303 connects the microcontroller module 302 to the communication bus that is described below with reference in FIG. 4. The communication from each monitoring module 300 is performed using conventional power line communication technique (also known as power line carrier). However, a unique transmission timing is utilized in order to avoid or minimize collisions. This technique will be explained with reference to a specific example of a monitor connected to a solar panel.

When the solar panel "wakes", i.e., starts to receive sun light and generate output power, the monitor initializes a timer to time $t_0$. The monitor may or may not send data at the initialization time. Then, the monitor collects data continuously, but transmits collected data only after a given period has past from $t_0$ or from the last transmission. For example, the monitor may transmit data every 15 minutes. Since the panels are spatially separated, they will most likely wake at different times, introducing randomness to the transmission time, so that each panel would transmit according to its own timer. That is, each monitor would transmit data at:

$$t_0 + xC,$$

where x is a whole natural number and C is a set constant, say 15 minutes. However, for each panel $t_0$ may be at a different time every morning.

As can be appreciated from the above, using the wake up time of the panel to initiate the timer introduces a measure of randomness that helps avoid collisions. According to another embodiment of the invention, another measure of randomness is introduced in the counter. For example, the transmission time may be calculated as $t_0+xC+\epsilon$, where $\epsilon$ is a random number provided by a random number generator, etc. Alternatively, the transmission time may be calculated as $t_0+x(C+\epsilon)$. Notably, the random number should be generated separately to each module to prevent the chance that two panels wake at the same time and increment the counter at the same rate, thereby colliding on each transmission attempt. This random element may be reintroduced for each time a transmission is sent. Other methods of introducing randomness may also be used.

FIG. 3B is a flow chart illustrating a method for transmission of data by the monitor 300 of FIG. 3A. At step 340 it is checked whether the panel has awaken (i.e., receives light and generates power at a predetermined level). If so, the process proceeds to step 342 where the timer is initialized and the counting is started. Data, such as current, voltage, temperature, illumination, power output, etc., is then collected and stored, e.g., in RAM 305, at step 344, which continues so long as the timer progresses and the panel has not gone to sleep (352). As explained above, optionally a further randomization is introduced, which is shown by step 346. Then at step 348 it is determined whether the time for transmitting data has been reached and, if so, the data is transmitted at step 350. In this particular example, the data that is transmitted is the data accumulated since initialization of the timer. However, other methodologies may be implemented. For example, the data may be data accumulated since last transmission or current data reading. At step 352 it is checked whether the panel assumed the sleep mode, e.g., illumination or power generation is below a threshold. If so, the process ends. Otherwise, counting and transmission of data continues.

The above schemes minimize or avoid collisions. However, if a collision does occur, since the transmission is only one way, the central system would not get the data and would not know what data was lost, and the sending monitors would also have no way of knowing that the data never reached the central system. As a result, when the central system analyzes the data and compares data from one panel to another, errors may be introduced if some data transmission was lost due to collision. For example, if the central unit tries to compare power generated by several panels between 1 pm and 2 pm, the comparison would be inaccurate if data from two or more panels collided at 1:30 pm and is missing from the calculation.

To avoid this problem, a scheme is adopted wherein the data is accumulated at each monitor. Then, at each transmission, the accumulated total value of the data is transmitted. For example, at time $t_{15}$ the power generated from wake to wake plus 15 minutes is transmitted. At time $t_{30}$ the power generated from wake to wake plus 30 minutes is transmitted, and so on. In this way, even if one or more transmission was not received by the central unit, the central unit can reconstruct the missing data by, for example, extrapolating it from the data from all of the transmissions that were received. Similar extrapolation may be done in order to put data that arrived at different times from different panels in order to compare between panels on a unified time-base. E.g. Curves of power production from the monitors could be extrapolated for each panel based on the data points that arrived, and then these curves could be compared in order to detect power anomalies or other problems and phenomena.

According to a further aspect of the invention, an interrupt message may be sent, which overrules all other messages. An interrupt message may be sent by any monitoring module 300, for example, whenever a rapid corrective action may be required. This may be when power drops suddenly, as due to malfunction, panel breakage due to hail storms or other cause, etc. The interrupt message may be sent at any time, regardless of the counter's position. In connection with the interrupt message, according to an aspect of the invention a wide band noise detector is implemented in the module 300. When the wideband noise detector detects noise above a certain threshold, it sends an interrupt message. Notably, this feature is implemented to identify arcing that may be caused due to an open connection in the system. That is, since the system voltage is relatively high, e.g., 400-600V, if a connection becomes separated, and potential may arc through the air. Such arcing can be detected as wideband noise. The wideband noise detector may be implemented as part of the controller 102, as shown in FIG. 3A, or as a separate unit.

Additionally, to assist in locating faults and deleterious conditions, each monitor has a unique ID, which is transmitted together with the data. In this way, the central unit can easily monitor each panel individually and the physical location of the panel corresponding to each data stream can be easily ascertained. Thus, for example, if every day at 2 pm there is power drop at one or more panels, their physical location can be easily ascertained by using the unique ID transmitted with the data. Then the status of the panels can be evaluated to see whether there is an obstacle that obscures the sun every day at 2 pm. Furthermore, if a geographic information sensor (such as a GPS) is attached to the monitoring module, it could directly transmit its location so the obstruction may be found and removed.

The central analysis unit may also used the ID information to perform data analysis by comparing the data from the particular panel to expected data obtained from external sources. That is, if the central analysis system knows the location, temperature, tilt, etc., of the panel having the particular ID, it may calculate expected power from this panel at the current prevailing conditions. If the data received from the panel substantially deviates from the expected power output, it may determine that the panel is faulty or some factors cause it to lose power. This is especially a beneficial feature in the topology of the embodiment described herein, since the maximum power point tracking is performed on an individual panel basis, so the power obtained should be commensurable with the expected power. That is, there is no error introduced due to tracking maximum power point on an average of several panels.

FIG. 4 shows a communication and analysis system, according to aspects of the invention, being associated with the monitoring module of FIG. 3A. FIG. 4 shows a system used for collecting data from each of the panels in a distributed power system and subsequent analysis of collected data. The system of FIG. 4 includes a number of panels 401 that generate power. Each panel includes a monitoring module such as the monitoring module 300. Data collected by the monitoring modules at the panels 402 are communicated by a module communication bus 404 to a communication translator 401. The communication translator 401 sends the date to a central analysis station 403 via a communication link 403. The central analysis station 403 receives the data that is transmitted via the communication bus 404, analyzes the data and displays the status of the panels corresponding to the time the data was collected.

In FIG. 4, one module communication bus 404 is shown for transmitting data from the monitoring modules 300 from a number of panels 402. The data may be transmitted on a single bus in the manner described above which eliminates or minimizes collisions. However, other transmission methods may be used. For example, the data from several panels may be multiplexed on the same module communication bus. Alternatively, each monitoring module 300 includes a separate module communication bus 404. The module communication buses 404 from the different monitoring modules carry the data from each monitoring module 300 to the communication translator 401.

The module communication bus 404 can be implemented in different ways. In one aspect of the invention, an off-the-shelf communication bus such as Ethernet, RS232 or RS485 is used. Using an off-the-shelf communication bus simplifies the design of the communication module 303 of the monitoring module 300 but requires separate cables. Other methods such as wireless communications or power line communications may also be used. When wired communication is used between the monitoring modules 300 and the communication translator 401, the communication translator 401 may be located in close physical proximity to the panels to reduce the length of the module communication bus 404 or buses. When wireless communication is used between the monitoring modules 300 and the communication translator 401, the communication translator 401 need not be in close physical proximity to the panels.

The communication translator 401 is used to convert the module communication bus or buses 404 to a standard communication protocol and physical layer. This enables receiving data from the monitoring module 300 on various data terminals, such as a computer or PDA. The central analysis station 403 may then be implemented as a software that is run on a standard PC, an embedded platform or a proprietary device.

In one aspect of the invention, unidirectional power line communication is used from the monitoring modules 300 to the central analysis station 403. With unidirectional communication, a mechanism for preventing cross-talk between the monitoring modules 300 may be provided. Such a mechanism may be implemented in the form of transmitting data from each of the monitoring modules 300 at preset times as explained with respect to FIG. 3B. In one aspect of the invention, a collision detection algorithm may be used to ensure the data is received without collisions at the central analysis station 403.

In one aspect of the invention, bidirectional communication is used between the central analysis station 403 and the monitoring modules 300. With bidirectional communication, the central analysis station 403 may proactively request the data collected by one or more of the monitoring modules 300.

The collected data is analyzed at the central analysis station 403. By analyzing the information from each of the monitoring modules, many causes for power losses can be detected. For example, when energy production from a panel is low on some hours of the day while the adjacent panels produce the same power on all hours, the low performance panel is probably shaded during the low production hours. Panels that produce little power in comparison to their adjacent panels might be constantly shaded, soiled or installed incorrectly. Comparison of the power output of each panel with its corresponding power output a year earlier may indicate that the output has diminished due to dust or soil collected on the panel. Additional data may be gathered from outside sources in order to monitor and evaluate the power production of the array. E.g. irradiance data from satellites, weather data from terrestrial stations, RADAR systems or satellites, or weather and irradiance forecasts based on historical data or computerized models, and so forth. Many more heuristics and algorithmic methods may be used to detect problems and help the owner of the system to pinpoint problems in the array. Having the unique ID transmitted with the data helps identify the panels and their physical location.

FIG. 5 shows a distributed power harvesting system, including a monitoring module, according to aspects of the invention. Configuration 50 enables connection of multiple power sources, for example solar panels 501 to a single power supply. The series connection of all of the solar panels is connected to an inverter 504. A central analysis station 500 is shown that is in communication with the monitoring modules 300 coupled to each of the solar panels 501. Station 500 may be incorporated into the inverter 504 or may be an independent unit.

In configuration 50, each solar panel 501 is connected to a separate power converter circuit 505. Power converter circuit 505 adapts optimally to the power characteristics of the connected solar panel 501 and transfers the power efficiently from input to output. Power converters 505 can be buck converters, boost converters, buck/boost converters, flyback or forward converters. The converters 505 may also contain a number of component converters, for example a serial connection of a buck and a boost converter.

Each converter 505 includes a control loop that receives a feedback signal, not from the output current or voltage, but rather from the input coming from the solar panel 501. An example of such a control loop is a maximum power point tracking (MPPT) loop in solar array applications. The MPPT loop in the converter locks the input voltage and current from each solar panel 501 to its optimal power point. The MPPT loop of the converter 505 operates to perform maximum power point tracking and transfers the input power to its output without imposing a controlled output voltage or output current.

Each converter 505 may include a monitoring module according to the aspects of the invention. For example, each converter 505 may include the monitoring module 300 of FIG. 3A. The communication link between the monitoring modules 300 and the central analysis station 500 may be wireless or wired. If wired, the connection may be done to each unit 505 individually or centrally via inverter 504. Note that there is additional value in monitoring the panels output when coupling it with MPPT tracking power converter 505, since this guaranties that the power monitored is at maximum power point, and therefore low power reading signify a real problem and are not merely a false-alarm that results from the current draw from a central inverter, which may not be optimal for each panel. Converters 505 can be connected in series or in parallel to form strings and arrays.

Conventional DC-to-DC converters have a wide input voltage range at the solar panel side and an output voltage predetermined and fixed on installation. In these conventional DC-to-DC voltage converters, the controller monitors the current or voltage at the input, and the voltage at the output. The controller determines the appropriate pulse width modulation (PWM) duty cycle to fix the input voltage to the predetermined value decreasing the duty cycle if the input voltage drops while varying the current extracted from the input. In converters 505, according to embodiments of the present invention, the controller monitors the voltage and current at its input and determines the PWM in such a way that maximum power is extracted, dynamically tracking the maximum point. In embodiments of the present invention, the feedback loop is closed on the input power in order to track maximum power rather than closing the feedback loop on the output voltage as performed by conventional DC-to-DC voltage converters.

The outputs of converters 505 are series connected into a single DC output into the inverter 504, which converts the series connected DC output to an alternating current power supply. If the output is not required to be AC, the inverter may be omitted, or other load, such as a central DC/DC converter or battery charger may be used instead.

The circuit of FIG. 5 provides maximum power available during continuous operation from each solar panel 501 by continuously performing MPPT on the output of each solar panel to react to changes in temperature, solar radiance, shading or other performance deterioration factors of each individual solar panel 501. As shown in FIG. 1, conventional solutions for combining power, perform MPPT on strings 103 or arrays of solar panels 101. As a result of having a separate MPPT circuit in each converter 505, and for each solar panel 501, in the embodiments of the present invention, each string 503 in the embodiment shown in FIG. 5 may have a different number of panels 501 connected in series. Furthermore panels 501 can be installed in different directions, as solar panels 501 do not have to be matched and partial shading degrades the performance of only the shaded panel. According to embodiments of the present invention, the MPPT circuit within the converter 505 harvests the maximum possible power from panel 501 and transfers this power as output regardless of the parameters of other solar panel 501.

Figure 6:
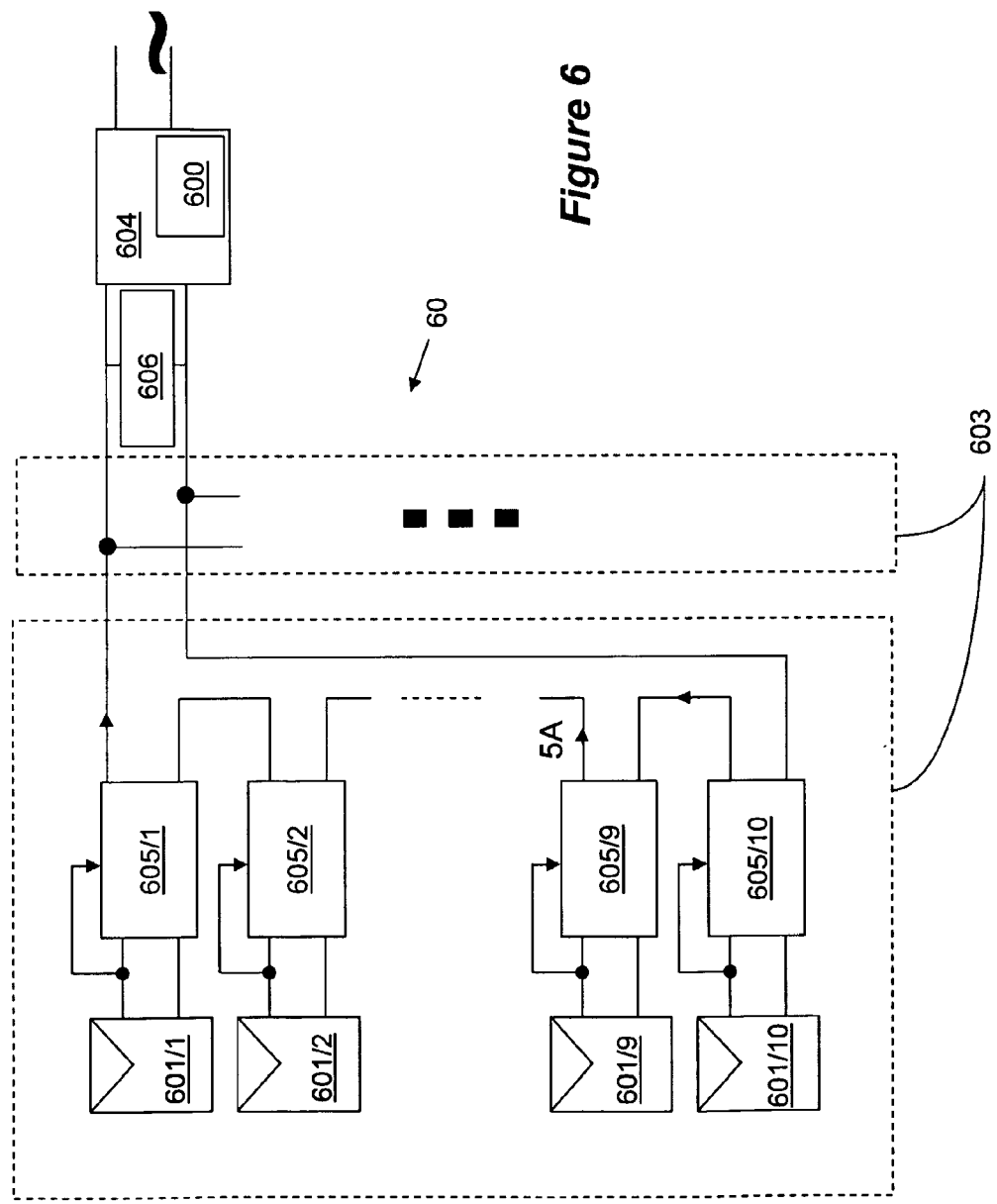
FIG. 6 illustrates a solar system according to another embodiment of the invention.

FIG. 6 illustrates a solar system according to another embodiment of the invention. The embodiment of FIG. 6 is similar to that of FIG. 5, in that panels 601 are connected in series to form strings 603. The strings 603 are then connected in parallel to inverter 604. The inverter 604 includes a central analysis station 600 that receives data from reporting modules within converters 605. Central station 600 also receives data from reporting module 606, which provides data relating to the entire power delivered from all of the panels.

Figure 7:
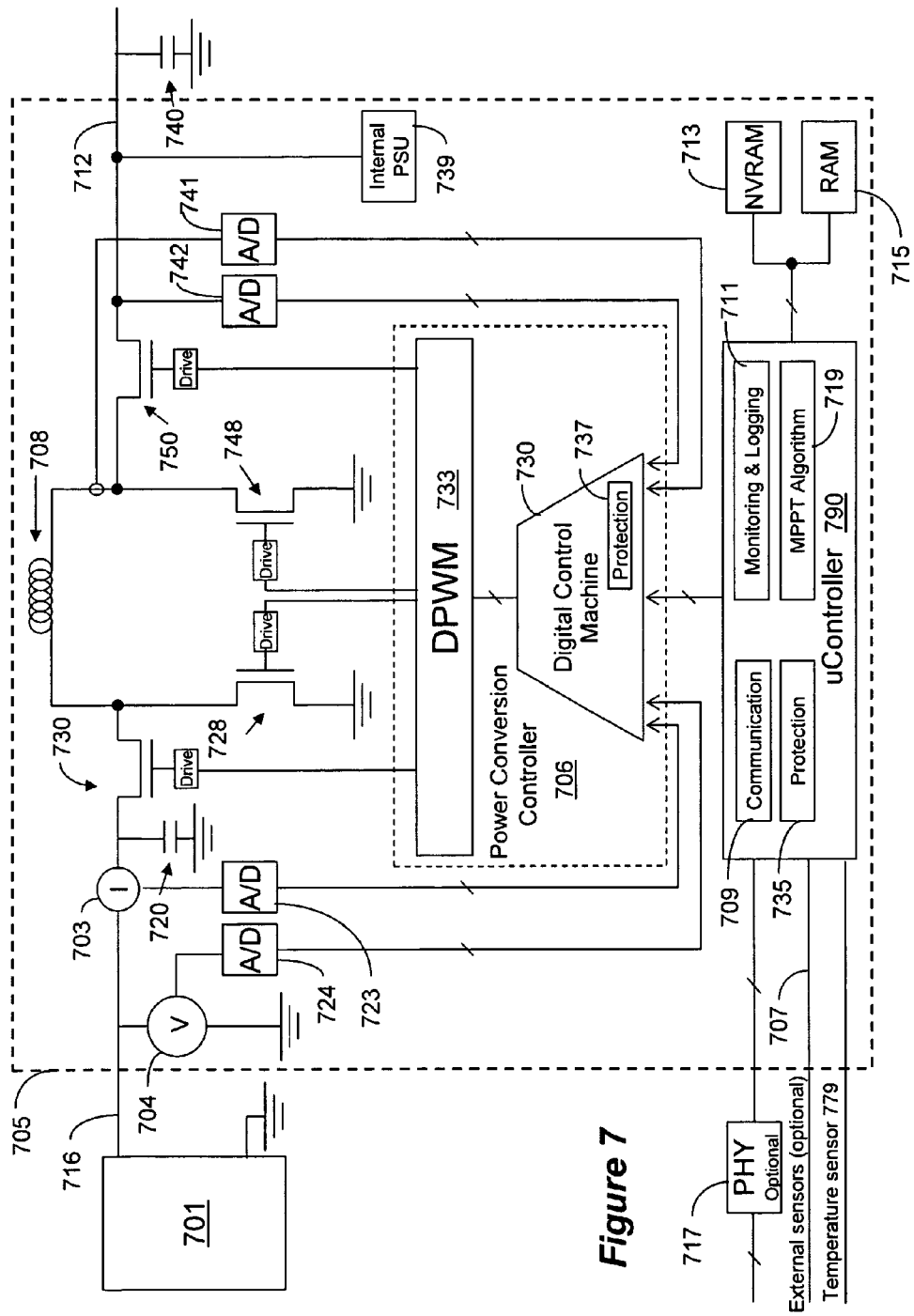
FIG. 7 illustrates a power converter, according to aspects of the invention.

FIG. 7 illustrates a power converter, according to aspects of the invention. FIG. 7 highlights, among others, a monitoring and control functionality of a DC-to-DC converter 705, according to embodiments of the present invention. A DC voltage source 701 is also shown in the figure. Portions of a simplified buck and boost converter circuit are shown for the converter 705. The portions shown include the switching transistors 728, 730, 748 and 750 and the common inductor 708. Each of the switching transistors is controlled by a power conversion controller 706.

The power conversion controller 706 includes the pulse-width modulation (PWM) circuit 733, and a digital control machine 730 including a protection portion 737. The power conversion controller 706 is coupled to microcontroller 790, which includes an MPPT module 719, and may also optionally include a communication module 709, a monitoring and logging module 711, and a protection module 735.

A current sensor 703 may be coupled between the DC power source 701 and the converter 705, and output of the current sensor 703 may be provided to the digital control machine 730 through an associated analog to digital converter 723. A voltage sensor 704 may be coupled between the DC power source 701 and the converter 705 and output of the voltage sensor 704 may be provided to the digital control machine 730 through an associated analog to digital converter 724. The current sensor 703 and the voltage sensor 704 are used to monitor current and voltage output from the DC power source, e.g., the solar panel 701. The measured current and voltage are provided to the digital control machine 730 and are used to maintain the converter input power at the maximum power point.

The PWM circuit 733 controls the switching transistors of the buck and boost portions of the converter circuit. The PWM circuit may be a digital pulse-width modulation (DPWM) circuit. Outputs of the converter 705 taken at the inductor 708 and at the switching transistor 750 are provided to the digital control machine 730 through analog to digital converters 741, 742, so as to control the PWM circuit 733.

A random access memory (RAM) module 715 and a non-volatile random access memory (NVRAM) module 713 may be located outside the microcontroller 706 but coupled to the microcontroller 706. The unique ID and other related data, such as serial number, manufacturer, manufacturing date, etc., may be stored in the NVRAM. A temperature sensor 779 and one or more external sensor interfaces 707 may be coupled to the microcontroller 706. The temperature sensor 779 may be used to measure the temperature of the DC power source 701. A physical interface 717 may be coupled to the microcontroller 706 and used to convert data from the microcontroller into a standard communication protocol and physical layer. An internal power supply unit 739 may be included in the converter 705.

In various aspects of the invention, the current sensor 703 may be implemented by various techniques used to measure current. In one aspect of the invention, the current measurement module 703 is implemented using a very low value resistor. The voltage across the resistor will be proportional to the current flowing through the resistor. In another aspect of the invention, the current measurement module 703 is implemented using current probes which use the Hall Effect to measure the current through a conductor without adding a series resistor. After translating the current to voltage, the data may be passed through a low pass filter and then digitized. The analog to digital converter associated with the current sensor 703 is shown as the A/D converter 723 in FIG. 7. Aliasing effect in the resulting digital data may be avoided by selecting an appropriate resolution and sample rate for the analog to digital converter. If the current sensing technique does not require a series connection, then the current sensor 703 may be connected to the DC power source 701 in parallel.

In one aspect of the invention, the voltage sensor 704 uses simple parallel voltage measurement techniques in order to measure the voltage output of the solar panel. The analog voltage is passed through a low pass filter in order to minimize aliasing. The data is then digitized using an analog to digital converter. The analog to digital converter associated with the voltage sensor 704 are shown as the A/D converter 724 in FIG. 7. The A/D converter 724 has sufficient resolution to generate an adequately sampled digital signal from the analog voltage measured at the DC power source 701 that may be a solar panel.

The current and voltage data collected for tracking the maximum power point at the converter input may be used for monitoring purposes also. An analog to digital converter with sufficient resolution may correctly evaluate the panel voltage and current. However, to evaluate the state of the panel, even low sample rates may be sufficient. A low-pass filter makes it possible for low sample rates to be sufficient for evaluating the state of the panel. The current and voltage date may be provided to the monitoring and logging module 711 for analysis.

The temperature sensor 779 enables the system to use temperature data in the analysis process. The temperature is indicative of some types of failures and problems. Furthermore, in the case that the power source is a solar panel, the panel temperature is a factor in power output production.

The one or more optional external sensor interfaces 707 enable connecting various external sensors to the converter 705. External sensors are optionally used to enhance analysis of the state of the solar panel 701, or a string or an array formed by connecting the solar panels 701. Examples of external sensors include ambient temperature sensors, solar radiance sensors, and sensors from neighboring panels. External sensors may be integrated into the converter 705 instead of being attached externally.

In one aspect of the invention, the information acquired from the current and voltage sensors 703, 704 and the optional temperature and external sensors 705, 707 may be transmitted to a central analysis station for monitoring, control, and analysis using the communications interface 709. The central analysis station is not shown in the figure. The communication interface 709 connects a microcontroller 706 to a communication bus. The communication bus can be implemented in several ways. In one aspect of the invention, the communication bus is implemented using an off-the-shelf communication bus such as Ethernet or RS422. Other methods such as wireless communications or power line communications may also be used. If bidirectional communication is used, the central analysis station may request the data collected by the microcontroller 706. Alternatively or in addition, the information acquired from sensors 703, 704, 705, 707 is logged locally using the monitoring and logging module 711 in local memory such as the RAM 715 or the NVRAM 713.

Analysis of the information from sensors 703, 704, 705, 707 enables detection and location of many types of failures associated with power loss in solar arrays. Smart analysis can also be used to suggest corrective measures such as cleaning or replacing a specific portion of the solar array. Analysis of sensor information can also detect power losses caused by environmental conditions and prevent costly and difficult solar array testing.

Consequently, in one aspect of the invention, the microcontroller 706 simultaneously maintains the maximum power point of input power to the converter 705 from the attached DC power source or solar panel 701 based on the MPPT algorithm in the MPPT module 719 and manages the process of gathering the information from sensors 703, 704, 705, 707. The collected information may be stored in the local memory 713, 715 and transmitted to an external central analysis station. In one aspect of the invention, the microcontroller 706 uses previously defined parameters stored in the NVRAM 713 in order to operate. The information stored in the NVRAM 713 may include information about the converter 705 such as serial number, the type of communication bus used, the status update rate and the ID of the central analysis station. This information may be added to the parameters collected by the sensors before transmission.

The converters 705 may be installed during the installation of the solar array or retrofitted to existing installations. In both cases, the converters 705 may be connected to a panel junction connection box or to cables connecting the panels 701. Each converter 705 may be provided with the connectors and cabling to enable easy installation and connection to solar panels 701 and panel cables.

In one aspect of the invention, the physical interface 717 is used to convert to a standard communication protocol and physical layer so that during installation and maintenance, the converter 705 may be connected to one of various data terminals, such as a computer or PDA. Analysis may then be implemented as software which will be run on a standard computer, an embedded platform or a proprietary device.

The installation process of the converters 705 includes connecting each converter 705 to a solar panel 701. One or more of the sensors 703, 704, 705, 707 may be used to ensure that the solar panel 701 and the converter 705 are properly coupled together. During installation, parameters such as serial number, physical location and the array connection topology may be stored in the NVRAM 713. These parameters may be used by analysis software to detect future problems in solar panels 701 and arrays.

When the DC power sources 701 are solar panels, one of the problems facing installers of photovoltaic solar panel arrays is safety. The solar panels 701 are connected in series during the day when there is sunlight. Therefore, at the final stages of installation, when several solar panels 701 are connected in series, the voltage across a string of panels may reach dangerous levels. Voltages as high as 600V are common in domestic installations. Thus, the installer faces a danger of electrocution. The converters 705 that are connected to the panels 701 may use built-in functionality to prevent such a danger. For example, the converters 705 may limit the output voltage to a safe level until a predetermined minimum load is detected. Only after detecting this predetermined load, the microcontroller 706 ramps up the output voltage from the converter 705.

Another method of providing a safety mechanism is to use communications between the converters 705 and the associated inverter for the string or array of panels. This communication, that may be for example a power line communication, may provide a handshake before any significant or potentially dangerous power level is made available. Thus, the converters 705 would wait for an analog or digital signal from the inverter in the associated array before transferring power to inverter.

The above methodology for monitoring, control and analysis of the DC power sources 701 may be implemented on solar panels or on strings or arrays of solar panels or for other power sources such as batteries and fuel cells.

The innovative monitoring described so far may be implemented in any solar panel installation, but is particularly beneficial for residential and relatively small installations. On the other hand, for large installations, such as, e.g., 025 megawatt solar field and larger, implementing monitoring on each panel may prove to be prohibitively expensive. Accordingly, the monitoring solution provided herein may be modified for such applications.

Figure 8:
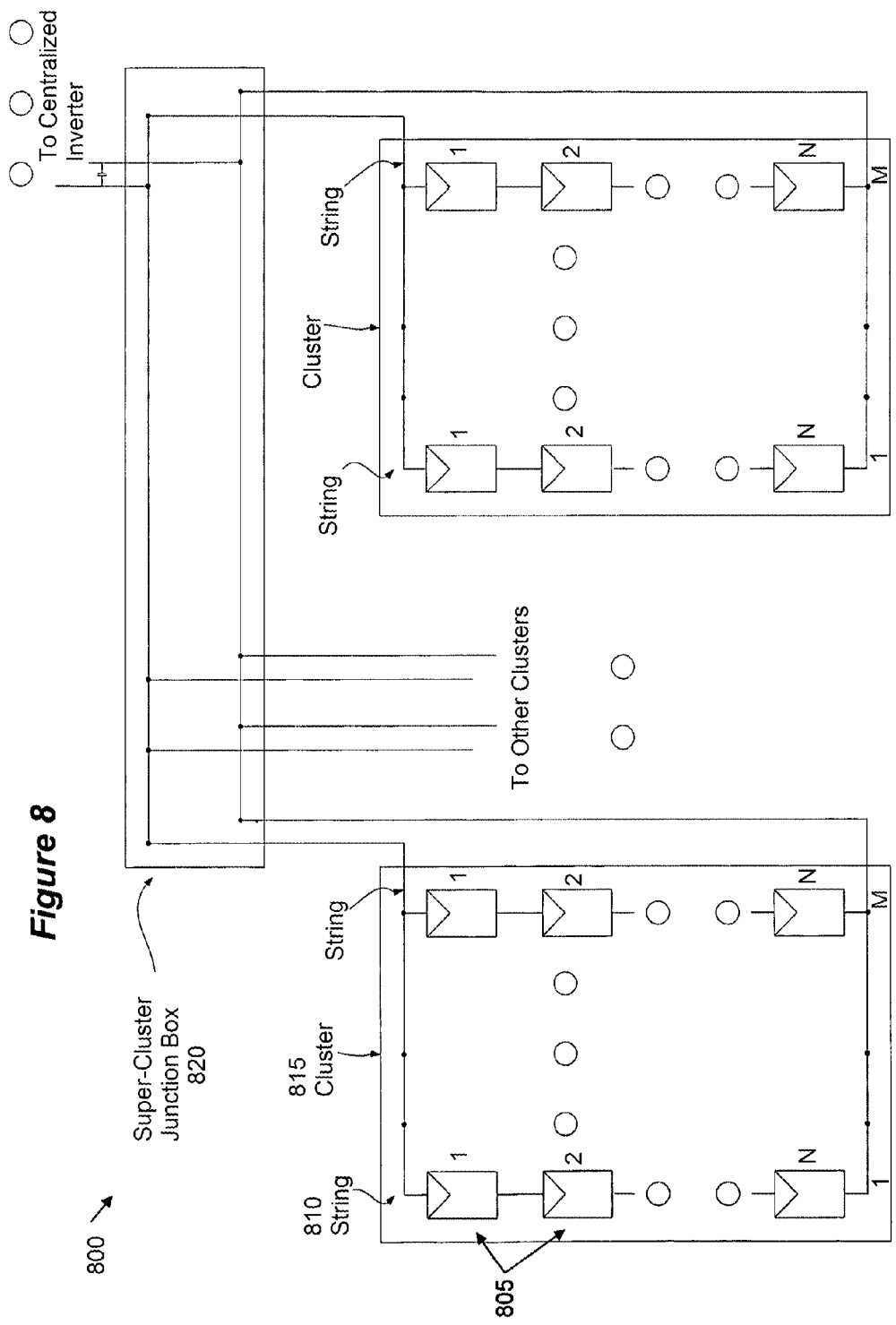
FIG. 8 illustrates a typical centralized solar field installation.

FIG. 8 illustrates a typical centralized solar field installation. In FIG. 8, a large field installation is formed by connecting several solar panels 805 in series so as to form a string 810. Normally 8-20 panels 805 are serially connected to form one string 810. Then, several strings, e.g., eight or twelve strings are connected in parallel to form a cluster 815. Several clusters are then connected together in a super cluster junction box 820, sometimes called a combiner box, to form a super cluster. The super cluster may be connected to a central inverter, or to other super clusters. According to the prior art, monitoring of such a system is done by measuring current and voltage at the output of the super cluster. However, such monitoring detects only major malfunctions and fails to detect smaller problems that, if corrected, can lead to higher efficiency. On the other hand, it has been proposed to provide a monitor at each panel and utilize master-slave arrangement to obtain performance data from each panel. However, such an arrangement is costly both in terms of the additional cost for each monitor on each panel (there are normally hundreds to tens of thousands of panels in large field installations) and in terms of complexity of the transmission requirements. For further background information the reader is directed to U.S. Patent Publication 2006/0162772.

Figure 9:
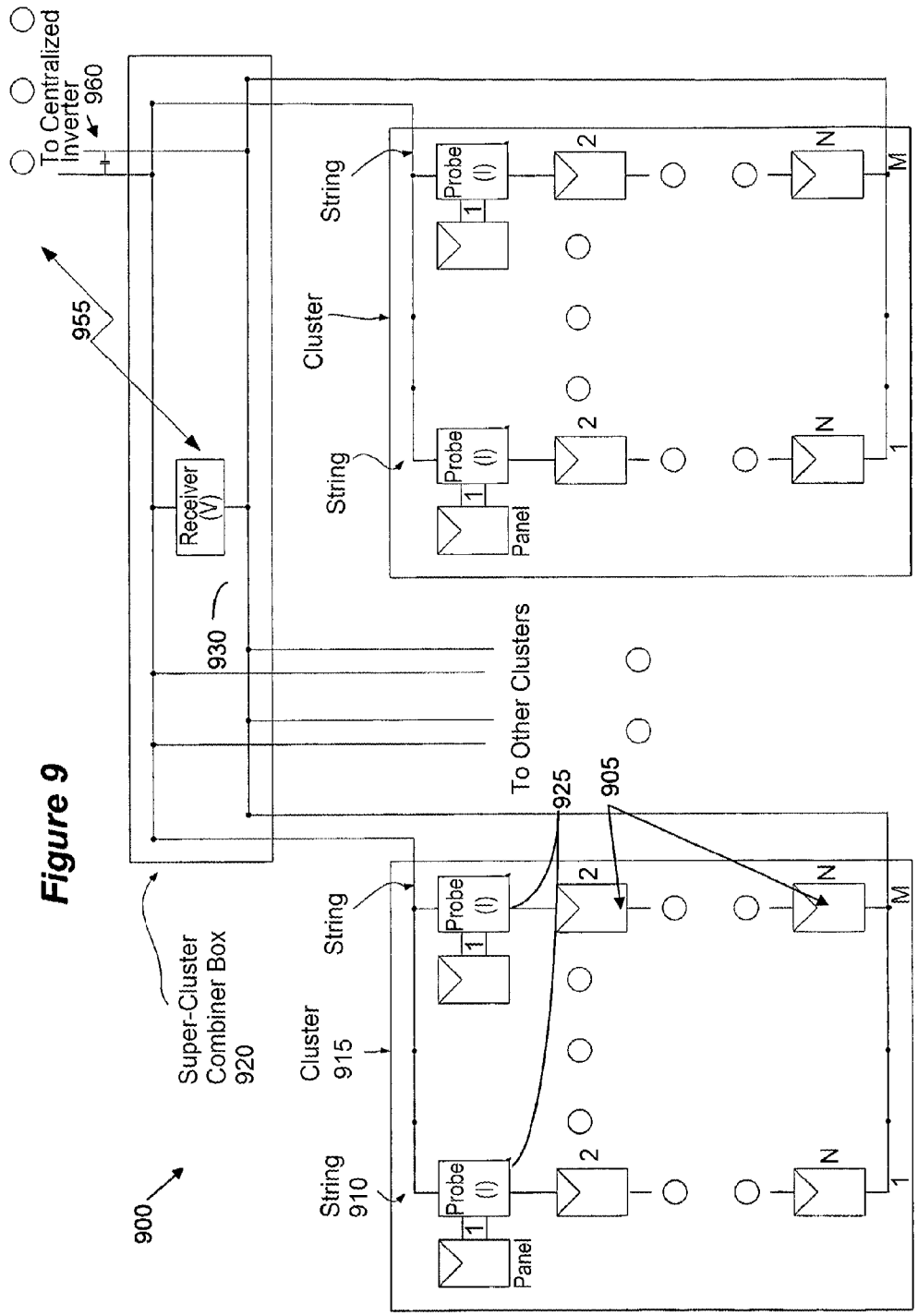
FIG. 9 illustrates a solar field installation implementing monitoring according to an embodiment of the invention.

FIG. 9 illustrates a centralized solar field installation implementing monitoring according to an embodiment of the invention. The system 900 is arranged with panels 905 serially connected to strings 910, which are connected in parallel to form clusters 915, which are in turn connected to a super cluster junction box 920. In the embodiment of FIG. 9 one monitor 925 is installed for each string 910 of serially connected panels 905. The monitor 925 may be the same monitor 300 as in FIG. 3A. On the other hand, in one embodiment the monitor 925 includes only a current probe and transmission means, which may be similar to that of monitor 300. While in FIG. 9 the monitor 925 is shown connected to the first panel 905, it may be connected to any of the serially connected panels in the string 910. Additionally, one voltage monitor 930 is connected at the super cluster junction box 920. A power unit may be used to feed monitors 925 and 930. The power may be derived from one of many power sources, such as batteries or feed-in from another location. In one embodiment monitors 925 and 930 may be fed from power harvested from the cable running through them—the solar panel being monitored in the case of monitor 925, and the current from one or more entire clusters 915 in the case of combiner box 920.

With the arrangement of FIG. 9, since each string 910 is connected in parallel to all other strings at the super cluster junction box 920, the voltage measured by the voltage monitor 930 indicates the voltage of each string 910. The voltage measurement is sent from the box 920 and the current is sent from each string separately to a central monitoring system (not shown). Alternatively, monitors 925 may send their data over power line communication or in other means to monitor 930, which then aggregates the data and sends it to central monitoring system. The monitor 930 may transmit the data it receives together with any data it monitors itself to a central monitoring station (not shown) using other transmission methods, such as Ethernet, wireless communication (WiFi, ZigBee, etc.) via one-way or two way communication, as illustrated by the arrow 955. Consequently, the central monitoring station can calculate the power production from each string. Such monitoring is more sensitive to power drops and other malfunctions at each string. This enables improved identification of failing or malfunctioning panels without the expense of installing monitor at each panel.

Additionally, rather than utilizing complicated master slave arrangement, in this embodiment the monitors 925 send the data using the power line communication via uni-directional communication method as explained above with respect to FIGS. 3A and 3B. This way, no dedicated bus is required and collisions are avoided by using the randomizing mechanism discussed above. Since solar fields may be very large and include many thousands or transmitting monitors, it is beneficial to prevent data transmitted in one part of the field to interfere with data transmitted in other parts. In an aspect of the invention, such a separation might me done by introducing capacitors 960 between the output terminals of each super cluster combiner box 920. This capacitor 920 is used to attenuate the PLC signaling in the super-cluster, and prevent interference with other super-clusters.

Figure 10:
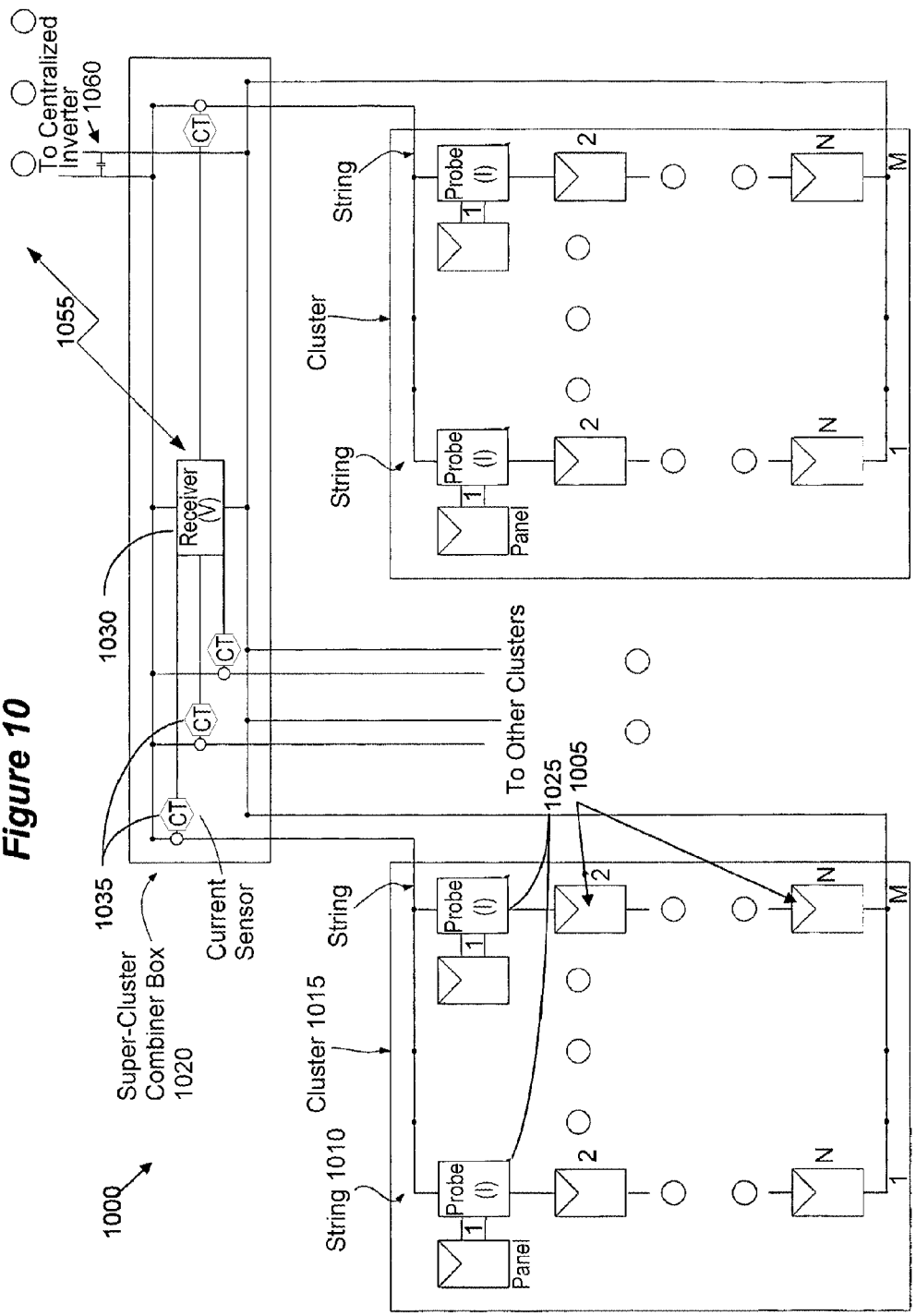
FIG. 10 illustrates a solar field installation implementing monitoring according to another embodiment of the invention.

FIG. 10 illustrates a solar field installation implementing monitoring according to another embodiment of the invention. The embodiment of FIG. 10 is similar to that of FIG. 9, except that a current monitor 1035 is added to measure the total current provided by each cluster 1010. The current measured at current monitor 1035 should be the sum of the current measurements of all of the monitors 1025. That is, the reading of current monitor should be commensurable to the sum of the reading reported by all of the monitors 1025 (less transmission losses). If an abnormal discrepancy is detected, then it means that at least one of the strings 1010 has problem with current delivery. This may be due to a faulty connector, bad cable isolation, or other factors. Thus, the problem is detected and could easily be pinpointed and fixed.

Embodiments of the invention, such as those described above, provide a greater degree of fault tolerance, maintenance and serviceability by monitoring, controlling, logging and/or communicating the performance of each solar panel 501, or strings of solar panels 503. A microcontroller used in the MPPT circuit of the converter 505, may include the monitoring module 300 of FIG. 3A. Then, this microcontroller may also be used to perform the monitoring, logging and communication functions. These functions allow for quick and easy troubleshooting during installation, thereby significantly reducing installation time. These functions are also beneficial for quick detection of problems during maintenance work. Furthermore, by monitoring the operation of each part of the system, preventive maintenance may be performed in a timely manner to avoid downtime of the system.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. A monitoring system for distributed DC power installation, comprising:
    a plurality of power sources, each of the power sources connected to a shared power line;
    a plurality of monitoring modules, each monitoring module associated with one of the power sources and collecting performance data of the associated power source and each monitoring module comprises a timer;
    a plurality of transmitters, each transmitter associated with one of the monitoring modules and transmitting the performance data of the associated monitoring module over the shared power line; and
    a plurality of controllers, each associated with one of the transmitters, initializing the timer of the associated monitoring module whenever the associated power source starts to generate power, and controlling the associated transmitter to transmit the performance data when elapsed time from initialization of the timer reaches a transmission time of the associated transmitter.

2. The monitoring system of claim 1, wherein each of the monitoring modules comprises:
    a current measurement module for collecting current data of the associated power source; and
    a voltage measurement module for collecting voltage data of the associated power source.

3. The monitoring system of claim 1, wherein each of the monitoring modules further comprises a temperature sensor module for sensing temperature data at the associated power source.

4. The monitoring system of claim 1, wherein each of the monitoring modules further comprises an arc detection module for detecting arcing at the power source.

5. The monitoring system of claim 1, wherein each of the monitoring modules further comprises a randomizer for including random time increments in the transmission times of the power source.

6. The monitoring system of claim 1 further comprising a memory storing the performance data accumulated since timer initialization.

7. The monitoring system of claim 6, further comprising:
    a central analysis station; and
    a communication translator for receiving the performance data from the monitoring modules and transmitting the performance data to the central analysis station.

8. The monitoring system of claim 7, wherein the central analysis station analyzes fault detection.

9. The monitoring system of claim 7, wherein the central analysis station compares measured power to expected power determined based on external data.

10. The monitoring system of claim 7, wherein each of the power sources comprises a solar panel.

11. The monitoring system of claim 7, wherein each of the power sources comprises a string of serially connected solar panels.

12. The monitoring system of claim 11, wherein each of the monitoring modules comprises a current measurement module for collecting current data.

13. The monitoring system of claim 12, further comprising:
    a connection box for parallel coupling all of the string of serially connected solar panels; and,
    a voltage measuring module measuring the voltage of the parallel coupling.

14. The monitoring system of claim 12, further comprising:
    a connection box for parallel coupling all of the string of serially connected solar panels; and,
    total current measuring module measuring the total current of the parallel coupling.

15. The monitoring system of claim 14, wherein the monitoring system detects current leakage by comparing output of the total current measuring module to a sum of the current measuring modules of each of the monitoring modules.

16. The system of claim 1, wherein the transmission time comprises a periodic time period component and a random time increment determined by the randomizer.

17. A method for monitoring distributed power harvesting systems including DC power sources, the method comprising:
    individually monitoring power generation at each of the DC power sources;
    when power generation passes a threshold at a first DC power source of the DC power sources,
    initializing a timer for the power source and
    collecting performance data for the first DC power source;
    monitoring elapsed time of the timer from initialization of the timer; and
    when the elapsed time reaches a transmission time associated with the first DC power source, transmitting the collected performance data at least over a power line shared with other DC power sources to a central analysis station.

18. The method of claim 17, wherein collecting performance data further comprises storing the performance data in memory, and wherein transmitting the collected performance data comprises transmitting the collected performance data accumulated since initialization of the timer.

19. The method of claim 18, wherein collecting performance data comprises measuring at least one of output voltage and output current.

20. The method of claim 17, further comprising:
    determining the transmission time by adding a random time increment from a randomizer to a periodic transmission time period of the first DC power source.

* * * * *